United States Patent
Murai

(10) Patent No.: US 11,792,968 B2
(45) Date of Patent: Oct. 17, 2023

(54) AUTOMATIC CONVEYANCE APPARATUS AND PRODUCTION SYSTEM COMPRISING SAME

(71) Applicant: FUJI CORPORATION, Chiryu (JP)

(72) Inventor: Masaki Murai, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/631,815

(22) PCT Filed: Aug. 1, 2019

(86) PCT No.: PCT/JP2019/030166
§ 371 (c)(1),
(2) Date: Jan. 31, 2022

(87) PCT Pub. No.: WO2021/019755
PCT Pub. Date: Feb. 4, 2021

(65) Prior Publication Data
US 2022/0279690 A1 Sep. 1, 2022

(51) Int. Cl.
*B23P 19/00* (2006.01)
*H05K 13/02* (2006.01)
(Continued)

(52) U.S. Cl.
CPC ....... *H05K 13/021* (2013.01); *H05K 13/0084* (2013.01); *H05K 13/0408* (2013.01); *H05K 13/0882* (2018.08)

(58) Field of Classification Search
CPC ............. H05K 13/0084; H05K 13/021; H05K 13/0408; H05K 13/0882
See application file for complete search history.

(56) References Cited

U.S. PATENT DOCUMENTS 5,456,001 A    10/1995    Mori et al.
6,988,612 B1 *    1/2006    Kabeshita .......... H05K 13/0061
                                                            198/817
(Continued)

FOREIGN PATENT DOCUMENTS

JP        2015044659 A * 3/2015
JP        2015058553 A * 3/2015
WO    WO 2018/173204 A1   9/2018

OTHER PUBLICATIONS

International Search Report dated Oct. 29, 2019 in PCT/JP2019/030166 filed on Aug. 1, 2019, 2 pages.

*Primary Examiner* — Paul D Kim
(74) *Attorney, Agent, or Firm* — Oblon, McClelland, Maier & Neustadt, L.L.P.

(57) ABSTRACT

An automatic conveyance apparatus includes a first loading surface, an adjustment device, a movement device, and a control section. The control section drives the movement device to move the member between the first loading surface and the second loading surface when the automatic conveyance apparatus is positioned at a member delivery position and/or a member pickup position where the automatic conveyance apparatus delivers and/or picks up the member and when the height and the inclination of the first loading surface are adjusted in accordance with the height position and the inclination position of the second loading surface by the adjustment device. The automatic conveyance apparatus is configured to travel between multiple predetermined positions including the member delivery position and/or the member pickup position.

7 Claims, 10 Drawing Sheets

(51) Int. Cl.
*H05K 13/08* (2006.01)
*H05K 13/00* (2006.01)
*H05K 13/04* (2006.01)

(56) References Cited

U.S. PATENT DOCUMENTS

| | | | |
|---|---|---|---|
| 7,102,148 B2* | 9/2006 | Kodama | H05K 13/0812 |
| | | | 700/121 |
| 8,584,350 B2* | 11/2013 | Kuroda | H05K 13/085 |
| | | | 29/721 |
| 8,792,180 B2* | 7/2014 | Teramoto | G02B 3/0031 |
| | | | 264/1.32 |
| 10,289,117 B1 | 5/2019 | Zou et al. | |

* cited by examiner

AUTOMATIC CONVEYANCE APPARATUS AND PRODUCTION SYSTEM COMPRISING SAME

TECHNICAL FIELD

The technique disclosed in the present specification relates to an automatic conveyance apparatus and a production system including the same.

BACKGROUND ART

Patent Literature 1 (International Publication No. WO2018/173204) discloses a moving robot used as an automatic conveyance apparatus. The moving robot is used in a factory provided with multiple production devices for producing a specific object. The moving robot can convey a member used in the production device in a state in which the member is loaded on a loading surface (hereinafter, referred to as a first loading surface) in the moving robot, deliver the conveyed member from the first loading surface to, for example, a supplying surface (hereinafter, referred to as a second loading surface) provided in the production device, and pick up a member used in the production device from the second loading surface to the first loading surface.

BRIEF SUMMARY

Technical Problem

For example, when the member is delivered, the moving robot of Patent Literature 1 stops in front of the production device and delivers the member on the supplying surface by moving the member in the front-rear direction on the first loading surface. However, in the moving robot of Patent Literature 1, the height or the inclination of the first loading surface does not change only by moving the member in the front-rear direction. Accordingly, for example, when a floor surface of a factory where the production device is provided is not flat since the height or the inclination of the second loading surface and the first loading surface do not always match, it can be difficult to move the member from the first loading surface to the second loading surface. The same can be applied when the member is picked up from the second loading surface to the first loading surface. In the present specification, there is a provided a technique for reliably moving a member from a first loading surface of an automatic conveyance apparatus to a second loading surface of a production device and/or from the second loading surface of the production device to the first loading surface of the automatic conveyance apparatus.

Solution to Problem

The present specification discloses an automatic conveyance apparatus. The automatic conveyance apparatus is employed together with a loading table for loading a member supplied from outside and a production device for producing a specific object by using the member loaded on the loading table, delivers the member before being used on the loading table, and picks up the member after being used from the loading table. The automatic conveyance apparatus includes a first loading surface, an adjustment device, a movement device, and a control section. The first loading surface is capable of loading the member. The adjustment device adjusts a height and an inclination of the first loading surface in accordance with a height position and an inclination position of a second loading surface provided on the loading table on which the member is loaded. The movement device moves the member from the first loading surface to the second loading surface and/or from the second loading surface to the first loading surface. The control section drives the movement device to move the member between the first loading surface and the second loading surface when the automatic conveyance apparatus is positioned at a member delivery position and/or a member pickup position where the automatic conveyance apparatus delivers and/or picks up the member and when the height and the inclination of the first loading surface are adjusted in accordance with the height position and the inclination position of the second loading surface by the adjustment device. The automatic conveyance apparatus is configured to travel between multiple predetermined positions including the member delivery position and/or the member pickup position.

The automatic conveyance apparatus described above includes the adjustment device that adjusts the height and the inclination of the first loading surface of the automatic conveyance apparatus in accordance with the height position and the inclination position of the second loading surface of the loading table on which the member is loaded. Accordingly, the automatic conveyance apparatus can adjust the height and the inclination of the first loading surface in accordance with the second loading surface by the adjustment device even when, for example, a floor surface of a factory is not flat. As a result, the automatic conveyance apparatus can reliably move the member from the first loading surface to the second loading surface and/or from the second loading surface to the first loading surface.

The present specification discloses a production system. The production system includes a loading table capable of loading a member supplied from outside, a production device configured to produce a specific object by using the member loaded on the loading table, and an automatic conveyance apparatus configured to deliver the member before being used and/or after being used on the loading table and pick up the member before being used and/or after being used. The automatic conveyance apparatus includes a first loading surface capable of loading the member and is configured to travel between multiple predetermined positions including a member delivery position and/or a member pickup position. The loading table includes a second loading surface capable of loading the member. The production system further includes an adjustment device, a movement device, and a control section. The adjustment device adjusts a height and an inclination of the first loading surface in accordance with a height position and an inclination position of the second loading surface. The movement device moves the member from the first loading surface to the second loading surface and/or from the second loading surface to the first loading surface. The control section drives the movement device to move the member between the first loading surface and the second loading surface when the automatic conveyance apparatus is positioned at the member delivery position and/or the member pickup position and when the height and the inclination of the first loading surface are adjusted in accordance with the height position and the inclination position of the second loading surface by the adjustment device.

The production system described above includes the adjustment device that adjusts the height and the inclination of the first loading surface of the automatic conveyance apparatus in accordance with the height position and the inclination position of the second loading surface of the loading table on which the member is loaded. As a result, the automatic conveyance apparatus can reliably move the member from the first loading surface to the second loading surface and/or from the second loading surface to the first loading surface even when, for example, a floor surface of a factory is not flat.

DESCRIPTION OF EMBODIMENTS

Figure 1:
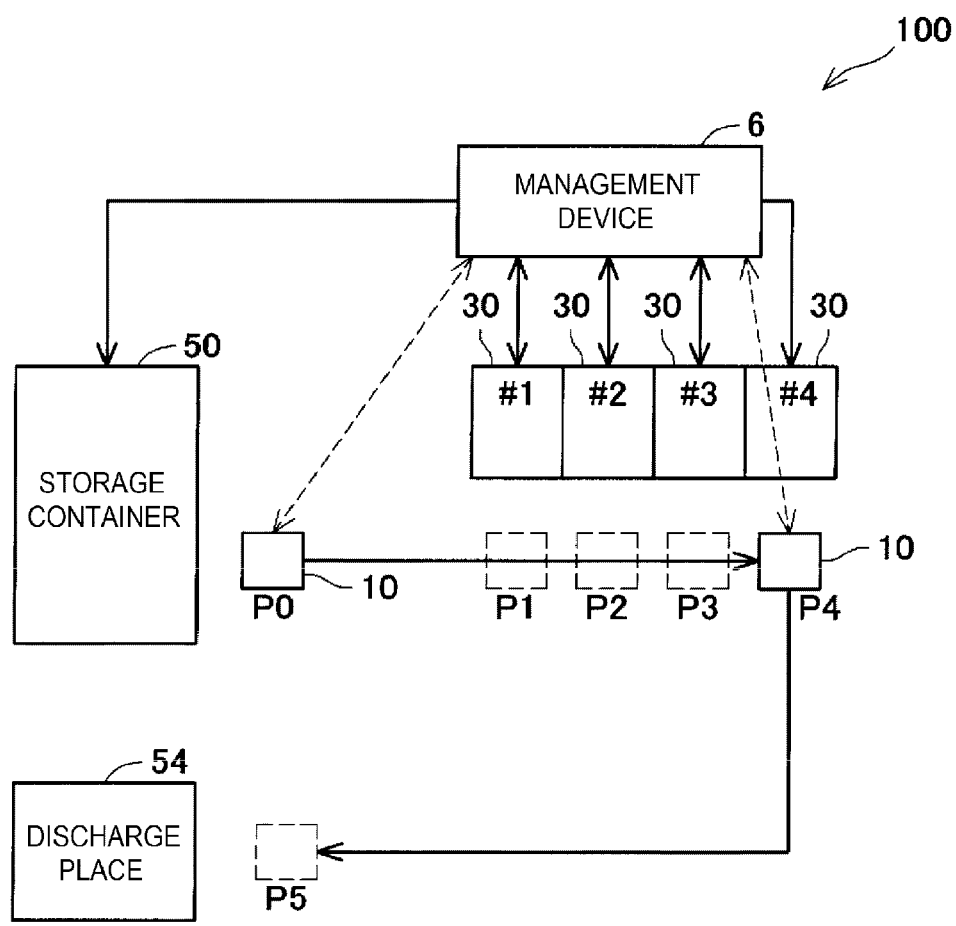
FIG. 1 is a plan view schematically showing a configuration of production system 100 including AGV 10 of an exemplary embodiment. An example of a traveling path on which AGV 10 travels is indicated by an arrow.

In one embodiment of the present technique, the movement device may move the member along the first loading surface and the second loading surface in a sliding manner when the height and the inclination of the first loading surface are adjusted in accordance with the height position and the inclination position of the second loading surface by the adjustment device. According to such a configuration, the member can be moved between the first loading surface and the second loading surface by merely sliding the member, and the configuration of the automatic conveyance apparatus (in particular, the movement device) can be simplified.

In one embodiment of the present technique, the production system may include the automatic conveyance apparatus described above, a loading table provided with the second loading surface capable of loading the member, a production device configured to produce a specific object by using the member loaded on the loading table, a memory section configured to store reference position data including a reference height position and a reference inclination position of the second loading surface with respect to a reference surface set in advance, and a measurement section configured to measure a height position and an inclination position of the first loading surface with respect to the reference surface. The adjustment device may adjust the height and the inclination of the first loading surface based on the reference position data stored in the memory section and the height position and the inclination position of the first loading surface measured by the measurement section. According to such a configuration, since the reference height position and the reference inclination position of the loading table on the production device side are stored, by measuring the height position and the inclination position of the first loading surface on the automatic conveyance apparatus side, the height and the inclination of the first loading surface can be adjusted based on these data.

In one embodiment of the present technique, the production system may include multiple loading tables provided with the second loading surface capable of loading the member. In this case, the memory section may store the reference position data of the second loading surface of the loading table for each of the multiple loading tables, and when the automatic conveyance apparatus is positioned at the member delivery position and/or the member pickup position of a specific loading table among the multiple loading tables, the adjustment device may adjust the height and the inclination of the first loading surface based on the reference position data of the specific loading table and the height position and the inclination position of the first loading surface measured by the measurement section. According to such a configuration, by storing the reference position data of the multiple loading tables, the height and the inclination of the first loading surface can be adjusted with respect to each of the loading tables.

In one embodiment of the present technique, the loading table may be provided in the production device and/or a storage container for storing the members at least temporarily. The storage container herein may include a storage container having a buffer function in the factory by temporarily storing the member.

In one embodiment of the present technique, the production device may be a component mounter configured to mount a component on a board, and the member may be a component supply feeder configured to supply the component to the component mounter. The specific configuration of the component supply feeder is not particularly limited and may be a tape type feeder that accommodates multiple components on a wound tape, a tray type feeder that accommodates multiple components on a tray, or a bulk type feeder that randomly accommodates multiple components in a container.

Exemplary Embodiment

Automated guided vehicle (AGV) 10 of the present exemplary embodiment and production system 100 including the same will be described with reference to the drawings. As an example, production system 100 can be employed in a factory in which component mounting machine 30 is provided. Component mounting machine 30 mounts electronic component (hereinafter, referred to as component 4) 4 on a circuit board (hereinafter, referred to as board 2). Component mounting machine 10 is also referred to as an electronic component mounter or a chip mounter. Component mounting machine 10 is provided together with other board work machines such as a solder printing machine and a board inspection machine to constitute a series of mounting lines.

Figure 2:
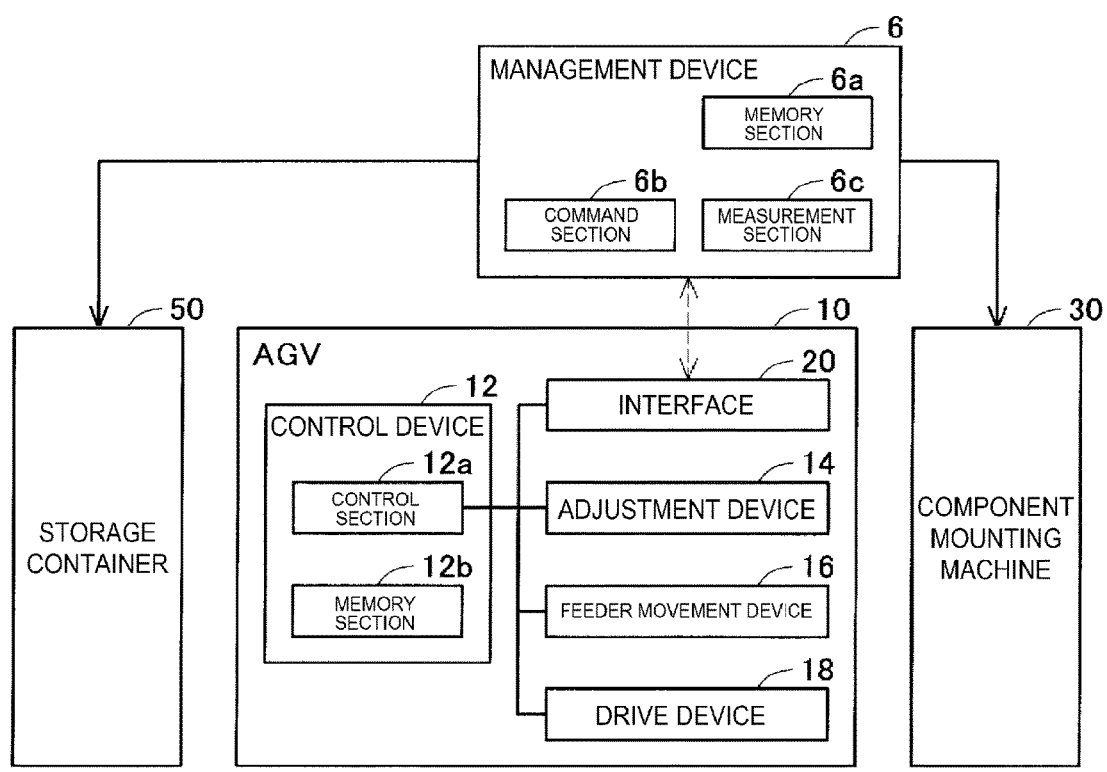
FIG. 2 is a block view showing a configuration of AGV 10 in detail.

As shown in FIGS. 1 and 2, production system 100 includes management device 6, multiple component mounting machines 30, multiple AGVs 10, and storage container 50. Management device 6 is communicably connected to each of component mounting machines 30, each of AGVs 10, and storage container 50 in a bidirectional manner. Management device 6 controls operations of multiple component mounting machines 30, multiple AGVs 10, and storage container 50, and manages the entire mounting line. AGV 10 is an example of an automatic conveyance apparatus according to the technique disclosed in the present specification and conveys component supply feeder 40 between multiple component mounting machines 30 and storage container 50. Further, in production system 100, multiple stop positions P1 to P5, which include multiple delivery positions/pickup positions for delivering and/or picking up component supply feeder 40 to/from each of component mounting machines 30 and storage container 50, are set. AGV 10 is configured to travel between multiple set stop positions (P1 to P5) and delivers and/or picks up component supply feeder 40 to/from component mounting machine 30 or storage container 50 (refer to FIG. 1). Although multiple component mounting machines 30 are arranged side by side in the x-direction, the number of component mounting machines 30 and the arrangement thereof to be arranged are not particularly limited.

Figure 3:
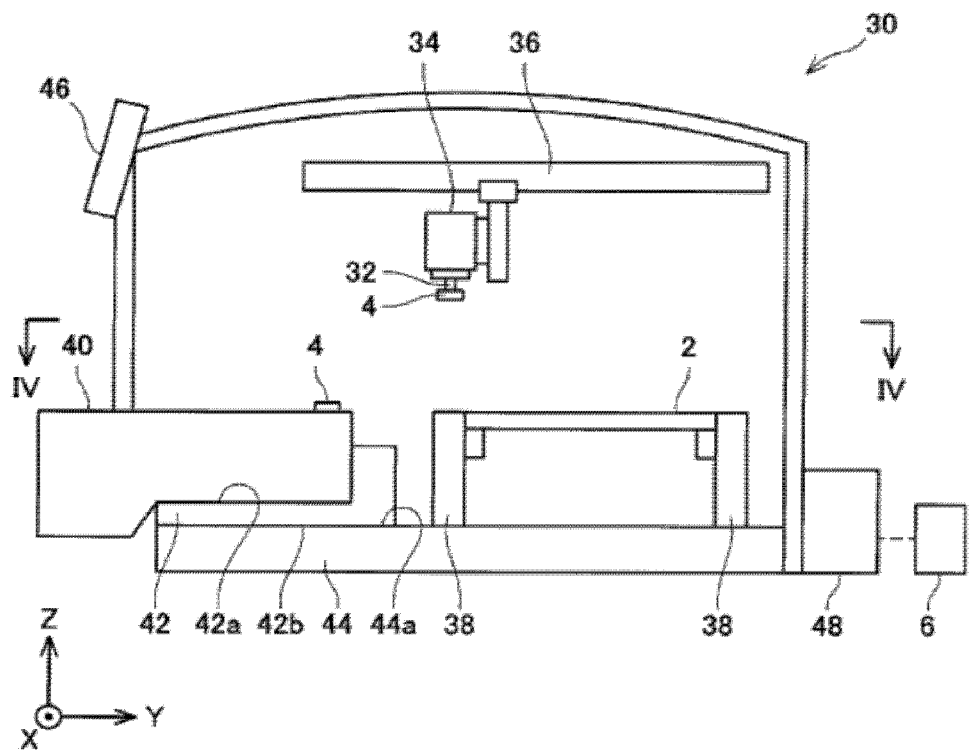
FIG. 3 is a view schematically showing a configuration of component mounting machine 30.
Figure 4:
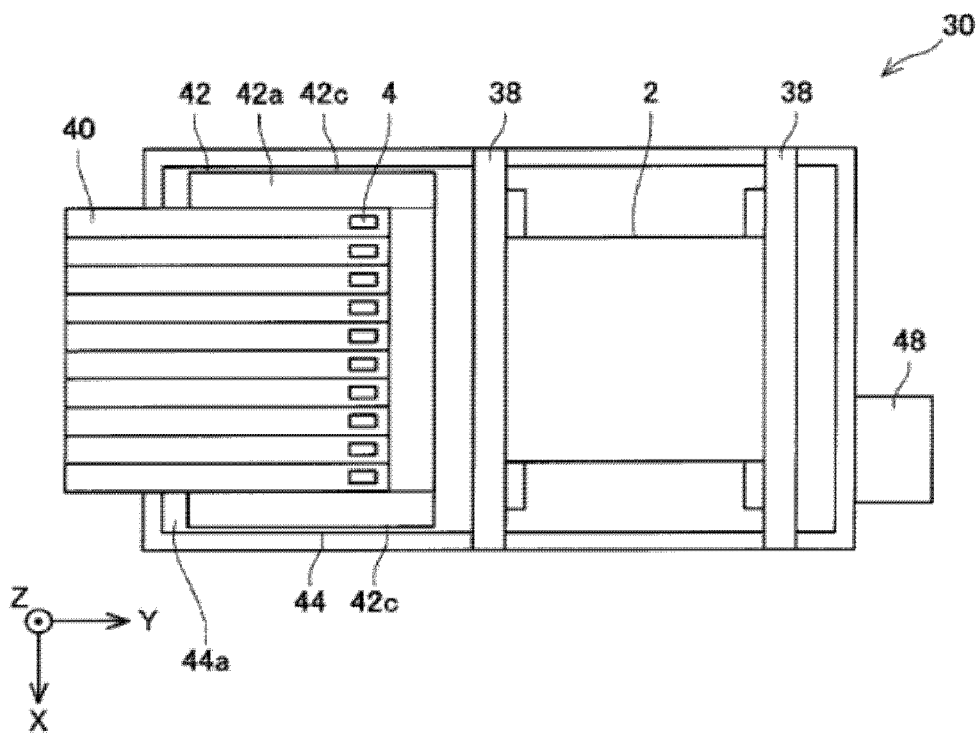
FIG. 4 is a cross-sectional view taken along line IV-IV in FIG. 3.
Figure 5:
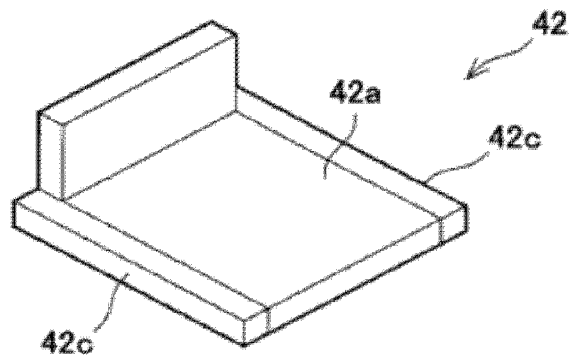
FIG. 5 is a perspective view showing device pallet 42.

Component mounting machine 30 on which component supply feeder 40 is installed will be described with reference to FIGS. 3 and 4. As shown in FIGS. 3 and 4, component mounting machine 30 includes multiple component supply feeders 40, device pallet 42, feeder installation table 44, mounting head 34, head movement device 36, board conveyor 38, touch panel 46, and mounting machine control device 48. Each of component supply feeders 40 accommodates multiple components 4. As shown in FIG. 5, device pallet 42 has a general plate shape and has upper surface 42a and lower surface 42b positioned on the opposite side of upper surface 42a. Upper surface 42a of device pallet 42 can install multiple component supply feeders 40 in an attachable and detachable manner. Device pallet 42 is attached on upper surface 44a of feeder installation table 44 in an attachable and detachable manner. By attaching device pallet 42 on which component supply feeder 40 is installed on upper surface 44a of feeder installation table 44, component supply feeder 40 is capable of supplying component 4 to mounting head 34. Upper surface 44a of feeder installation table 44 is an example of a second loading surface according to the technique disclosed in the present specification.

Mounting head 34 holds one or multiple suction nozzles 32 in an attachable and detachable manner, picks up component 4 supplied by component supply feeder 40 by using suction nozzles 32, and mounts component 4 on board 2. At this time, head movement device 36 moves mounting head 34 with respect to component supply feeder 40 and board 2. As a result, component 4 is picked up from a specific component supply feeder 40 among multiple component supply feeders 40 so that component 4 is mounted on a position of board 2 set in advance. Board conveyor 38 loads, supports, and unloads board 2 along the x-direction. Touch panel 46 is a display device that provides an operator with various information of component mounting machine 30, as well as an input device that receives commands or information from the operator. Mounting machine control device 48 is configured with a computer including a CPU and a storage device. Mounting machine control device 48 is communicably connected to management device 6. Mounting machine control device 48 controls the operation of each section of component mounting machine 30 based on a production program transmitted from management device 6.

Figure 6:
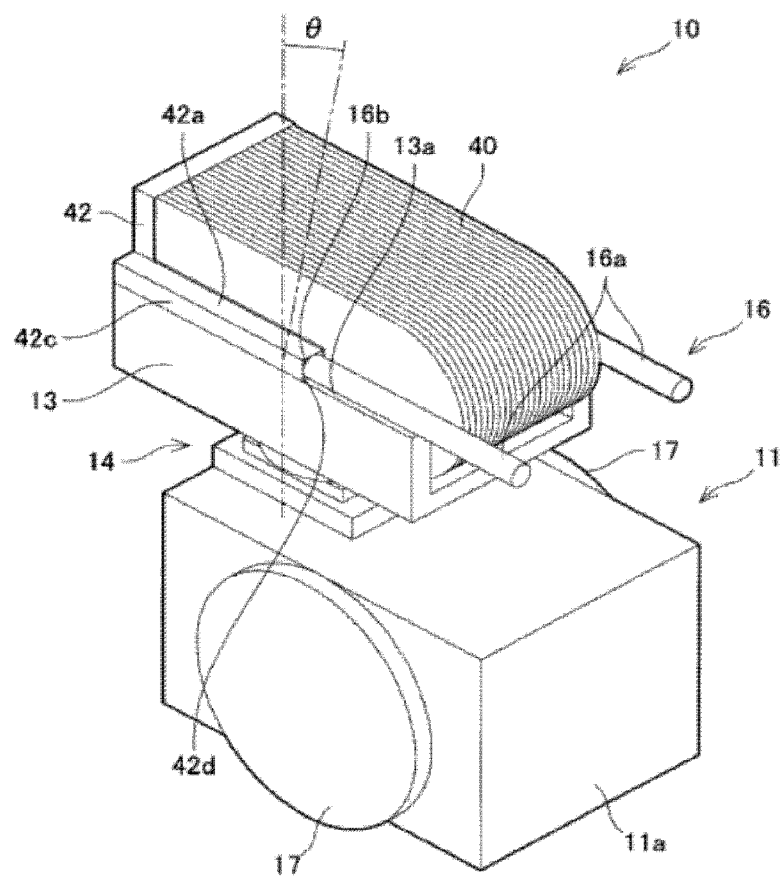
FIG. 6 is a perspective view showing an appearance of AGV 10. Feeder movement device 16 illustrates only cylinder section 16a, and the other configurations are not illustrated. Similar to FIG. 6, feeder movement device 16 is partially illustrated in FIGS. 7, 9, 11, 12, 14, 15, and 16.
Figure 7:
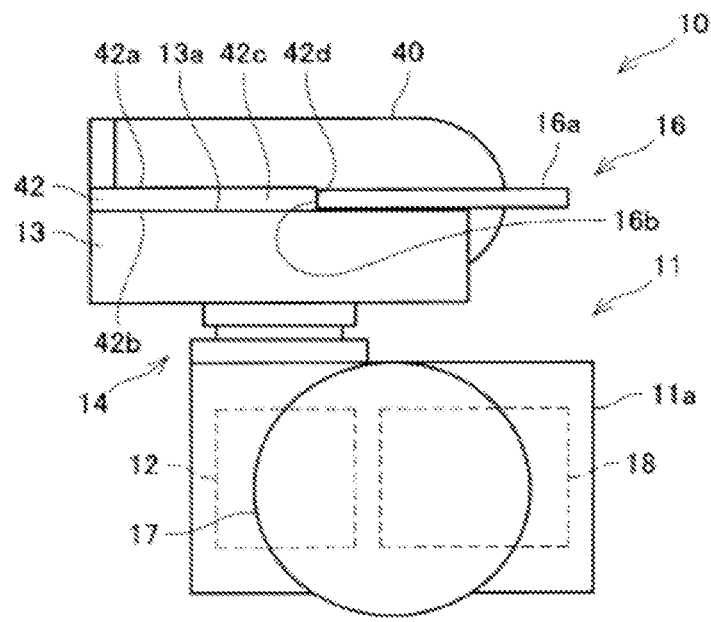
FIG. 7 is a side view showing a configuration of AGV 10.

AGV 10 that conveys component supply feeder 40 will be described with reference to FIGS. 2, 6, and 7. AGV 10 picks up multiple component supply feeders 40 before being used from storage container 50 and delivers component supply feeder 40 before being used to component mounting machine 30 (that is, feeder installation table 44). Alternatively, AGV 10 picks up component supply feeder 40 after being used from feeder installation table 44 of component mounting machine 30. As shown in FIGS. 6 and 7, AGV 10 includes vehicle body 11, wheels 17, adjustment device 14, feeder movement device 16, drive device 18, and control device 12 that controls each section of AGV 10. Vehicle body 11 includes vehicle body main body 11a that rotatably supports wheels 17, and pallet holding section 13 disposed on vehicle body main body 11a via adjustment device 14. Pallet holding section 13 has a pair of loading surfaces 13a arranged at intervals in the width direction of vehicle body 11. Component supply feeder 40 is configured to be loadable on the pair of loading surfaces 13a together with device pallet 42. That is, the pair of loading surfaces 13a supports both ends 42c of lower surface 42b of device pallet 42. Further, feeder movement device 16 is provided on each of loading surfaces 13a.

Feeder movement device 16 is a device that moves component supply feeder 40 from loading surface 13a, for example, to upper surface 44a of feeder installation table 44 of component mounting machine 30 and is driven by control device 12. Specifically, the movement device moves component supply feeder 40 along the pair of loading surfaces 13a and upper surface 44a of feeder installation table 44 in a sliding manner. The feeder movement device 16 has a pair of cylinder sections 16a. Each of the pair of cylinder sections 16a is provided with a piston mechanism. A catch mechanism (not shown) is provided at distal end 16b of each cylinder section 16a. The catch mechanism is configured to be capable of gripping end section 42d of device pallet 42. By operating the piston mechanism in a state of gripping device pallet 42, feeder movement device 16 can move device pallet 42, that is, component supply feeder 40 in the front-rear direction of vehicle body 11. After device pallet 42 is moved to a predetermined position on the pair of loading surfaces 13a or a predetermined position on upper surface 44a of feeder installation table 44, the gripping of device pallet 42 by feeder movement device 16 is released, so that device pallet 42 is released from feeder movement device 16. As a result, AGV 10 can deliver component supply feeder 40 to component mounting machine 30 or storage container 50 or can pick up component supply feeder 40 from component mounting machine 30 or storage container 50. In the present exemplary embodiment, feeder movement device 16 moves component supply feeder 40 (more specifically, device pallet 42) between loading surface 13a and upper surface 44a of feeder installation table 44 in a sliding manner. Therefore, component supply feeder 40 can be moved with a small amount of power and the configuration of AGV 10 can be simplified.

Adjustment device 14 is a device, which is disposed between vehicle body main body 11a and pallet holding section 13 and adjusts the height and the inclination of loading surface 13a of pallet holding section 13, for example, in accordance with the height position and the inclination position of upper surface 44a of feeder installation table 44 of component mounting machine 30, and is driven by control device 12. Adjustment device 14 includes an actuator (not shown) and can adjust the position and the inclination (the inclination of vehicle body 11 in the front-rear direction (θ in FIG. 6) and the inclination in the left-right direction) of the pair of loading surfaces 13a in the up-down direction. Adjustment device 14 includes a detection section that detects the drive amount of the actuator and can adjust the pair of loading surfaces 13a to the desired height position and the desired inclination position by controlling the drive amount, which is detected by the detection section, to a target drive amount. Accordingly, the detection section that detects the drive amount of the actuator of adjustment device 14 serves as a measurement section that measures the height and the inclination of loading surface 13a. A well-known mechanism for adjusting the height and the inclination of the loading surface can be used as adjustment device 14.

Drive device 18 is a device that drives wheels 17 to cause AGV 10 to travel and is driven by control device 12. Drive device 18 is configured to be capable of independently driving left and right wheels 17, capable of causing AGV 10 to travel in the front-rear direction, and capable of freely adjusting the advancing direction of AGV 10. Accordingly, AGV 10 can be stopped at any designated position and in any direction.

Control device 12 controls feeder movement device 16, adjustment device 14, and drive device 18. Control device 12 is constituted by a computer including a CPU, a ROM, and a RAM. Control device 12 includes control section 12a and memory section 12b, and various functions are assigned to control device 12 by executing a program installed in advance. As an example, control device 12 serves as control section 12a that performs a process of driving feeder movement device 16 to move component supply feeder 40 from loading surface 13a, a process of driving adjustment device 14 to adjust the height and the inclination positions of loading surface 13a, and a process of driving drive device 18 to cause AGV 10 to travel to any position. Control device 12 stores, for example, a command transmitted from management device 6, and also serves as memory section 12b that stores a map in the factory. The map referred to herein includes stop positions P1 to P4 set for each component mounting machine 30, and stop position P0 set for storage container 50 or stop position P5 (also referred to as discharge position P5) for discharging component supply feeder 40 after being used to discharge place 54 (refer to FIG. 1).

AGV 10 includes interface 20. AGV 10 is communicably (e.g., wirelessly) connected to management device 6 in a bidirectional manner, and the command from management device 6 can be received via interface 20.

Figure 8:
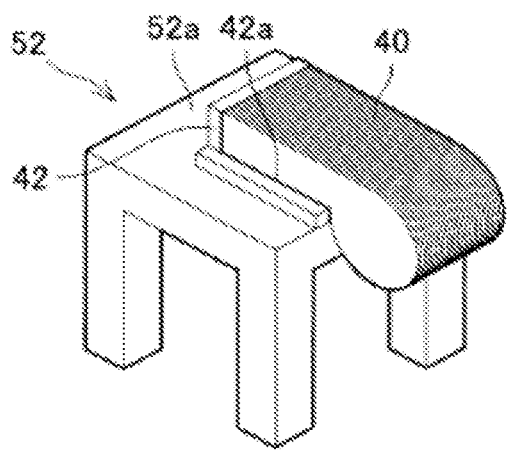
FIG. 8 is a view showing a state in which component supply feeder 40 and device pallet 42 are loaded on feeder installation table 52 of storage container 50. Other configurations than feeder installation table 52 of storage container 50 are not illustrated.

Storage container 50 will be described with reference to FIG. 8. Storage container 50 stores multiple component supply feeders 40 before being used in component mounting machine 30. As shown in FIG. 8, storage container 50 includes feeder installation table 52. Device pallet 42 to which multiple component supply feeders 40 are attached is configured to be loadable on upper surface 52a of feeder installation table 52. Storage container 50 is communicably connected to management device 6. As an example, storage container 50 installs device pallet 42, to which component supply feeder 40 designated in response to the command from management device 6 is attached, on upper surface 52a of feeder installation table 52. Further, storage container 50 reports an inventory status of component supply feeder 40 in storage container 50 to management device 6.

Management device 6 will be described with reference to FIG. 2. Management device 6 is communicably connected to each of component mounting machines 30, each of the AGVs 10, and storage container 50, and manages all of these devices. Management device 6 is constituted by a computer including a CPU, a ROM, and a RAM. As shown in FIG. 2, management device 6 includes memory section 6a and command section 6b, and various functions are assigned to management device 6 by executing the program installed in advance. As an example, management device 6 stores reference position data of each of component mounting machines 30 with respect to a reference surface set in advance and also serves as memory section 6a that stores a production plan in the factory. The reference position data includes a reference height position and a reference inclination position with respect to the reference surface for upper surface 44a of feeder installation table 44 of each component mounting machine 30. Management device 6 serves as command section 6b that transmits the command for controlling each component mounting machine 30, each AGV 10, and storage container 50 based on the stored production plan, to each of component mounting machines 30, AGVs 10, and storage container 50.

The floor surface of the factory in which production system 100 described above is provided may be uneven. Therefore, the heights or the inclinations between upper surface 44a of feeder installation table 44 of component mounting machine 30 and loading surface 13a of AGV 10 do not necessarily match each other. Therefore, it may be difficult to deliver component supply feeder 40 to upper surface 44a of feeder installation table 44 of component mounting machine 30 by simply moving component supply feeder 40 from loading surface 13a in the front-rear direction in a sliding manner. The same can be applied when the member is picked up from upper surface 44a of feeder installation table 44 to loading surface 13a of AGV 10.

In the present exemplary embodiment, AGV 10 includes, for example, adjustment device 14 that adjusts the height and the inclination of loading surface 13a of AGV 10 in accordance with the height position and the inclination position of upper surface 44a of feeder installation table 44 of component mounting machine 30. Accordingly, in AGV 10, even when the floor surface of the factory is uneven, the height and the inclination of loading surface 13a of AGV 10 can be adjusted in accordance with upper surface 44a of feeder installation table 44 by adjustment device 14. As a result, AGV 10 can reliably move the member from loading surface 13a to upper surface 44a of feeder installation table 44 of component mounting machine 30 and/or from upper surface 44a of feeder installation table 44 to loading surface 13a of AGV 10. Upper surface 44a of feeder installation table 52 of component mounting machine 30 is an example of the second loading surface of the loading table in the technique disclosed in the present specification. The second loading surface of the loading table is not limited to this and may be, for example, upper surface 52a of feeder installation table 52 of storage container 50.

Figure 9:
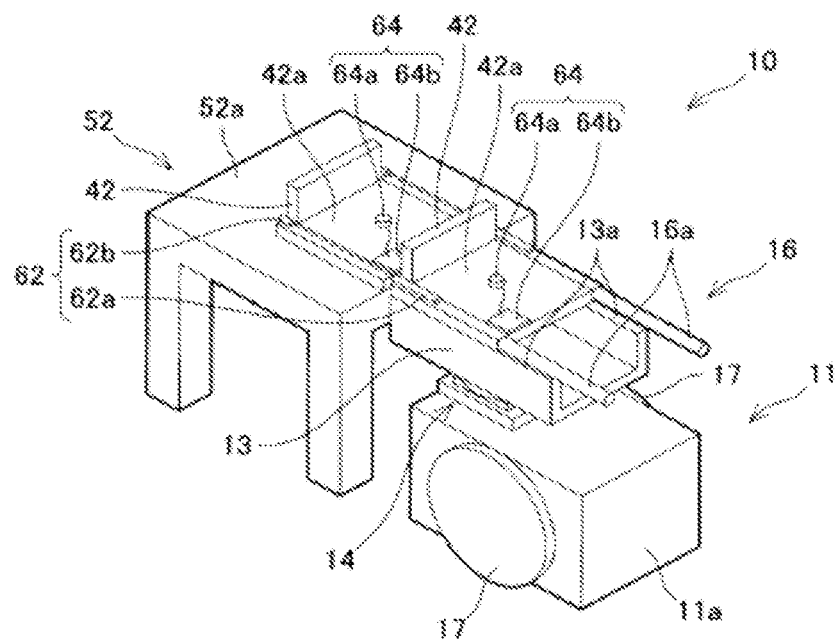
FIG. 9 is a view describing a measurement procedure for measuring height positions and inclination positions of upper surfaces 44a and 52a of feeder installation tables 44 and 52 with respect to a reference surface.

In production system 100 of the present exemplary embodiment, management device 6 includes measurement section 6c and measurement device 60. By using measurement section 6c and measurement device 60, AGV 10 performs advance preparation before the delivery and picking up of device pallet 42. The advance preparation will be described with reference to FIG. 9. Measurement device 60 is a device used for measuring the height position and the inclination position of loading surface 13a of AGV 10 at each delivery/pickup position. Measurement section 6c of management device 6 calculates a target height position and a target inclination position of loading surface 13a of each AGV 10 with respect to a reference surface set in advance based on data measured by measurement device 60. As shown in FIG. 9, measurement device 60 includes a pair of height measurement devices 62 installed in the width direction of vehicle body 11 and an inclination measurement device 64 installed in the center of device pallet 42. As an example, the height measurement device 62 can be constituted by laser light projector 62a that emits laser and laser light receiver 62b that receives the laser. Inclination measurement device 64 has sensor 64a that measures the inclination, transmitter 64b that transmits data measured by sensor 64a, and a receiver (not shown) that receives the data from transmitter 64b. However, the specific configuration or the measuring means of measurement device 60 is not limited to this, and loading surface 13a with respect to the reference surface may be measured by using other means.

Hereinafter, the measurement procedure will be described. The procedure for measuring the height position and the inclination position of upper surface 44a of feeder installation table 44 and upper surface 52a of feeder installation table 52 with respect to the reference surface (in the present exemplary embodiment, loading surface 13a in an initial state of AGV 10 positioned at each of stop positions P0 to P5) will be described as an example. Although not particularly limited, in the present exemplary embodiment, the operator performs a series of operations using measurement device 60. First, AGV 10 is positioned at stop position P0 of storage container 50. At this time, loading surface 13a of AGV 10 is set in the initial state. Next, device pallet 42 is installed on each of loading surface 13a of AGV 10 and upper surface 52a of feeder installation table 52 of storage container 50. After device pallet 42 is installed, each of inclination measurement device 64 and laser light projector 62a is installed at a predetermined position on upper surface 42a of device pallet 42 installed in AGV 10. Further, inclination measurement device 64 and laser light receiver 62b are installed at predetermined positions of device pallet 42 installed on upper surface 52a of feeder installation table 52. Next, adjustment device 14 of AGV 10 is manually driven from the initial state, and the height position and the inclination of device pallet 42 installed in AGV 10 are adjusted to match those of device pallet 42 installed on feeder installation table 52. Specifically, the position is adjusted such that light of laser light projector 62a can be received by laser light receiver 62b, and also the two inclination measurement devices 64 are adjusted so as to have the same value. When the adjustment of two device pallets 42 is ended, the drive amount (that is, the drive amount of the actuator) of adjustment device 14 from the initial state is transmitted to management device 6. Measurement section 6c of management device 6 calculates the height position and the inclination position of upper surface 52a of feeder installation table 52 with respect to the reference surface at stop position P0 based on the received drive amount of adjustment device 14. The calculated height position and the inclination position of upper surface 52a of feeder installation table 52 are stored in memory section 6a. The above-described measurement is performed for each of stop positions P1 to P5. As a result, the height positions and the inclination positions of upper surface 44a of feeder installation table 44 and upper surface 52a of feeder installation table 52 at each of stop positions P0 to P5 are measured, and the measured positions are stored in memory section 6a. Management device 6 may transmit the height positions and the inclination positions of upper surface 44a of feeder installation table 44 and upper surface 52a of feeder installation table 52 at each of stop positions P0 to P5 to AGV 10.

In production system 100 of the present exemplary embodiment, AGV 10 stores the height positions and the inclination positions of upper surface 44a of feeder installation table 44 and upper surface 52a of feeder installation table 52 at each of stop positions P0 to P5 and adjusts the drive amount of adjustment device 14 in accordance with the stored height positions and inclination positions. As a result, the height and the inclination of loading surface 13a of AGV 10 can be adjusted in accordance with upper surface 44a of feeder installation table 44 and upper surface 52a of feeder installation table 52. Therefore, in various usage environments (in which conditions of traveling surfaces are different), the automatic exchange of component supply feeder 40 can be suitably performed.

Figure 10:
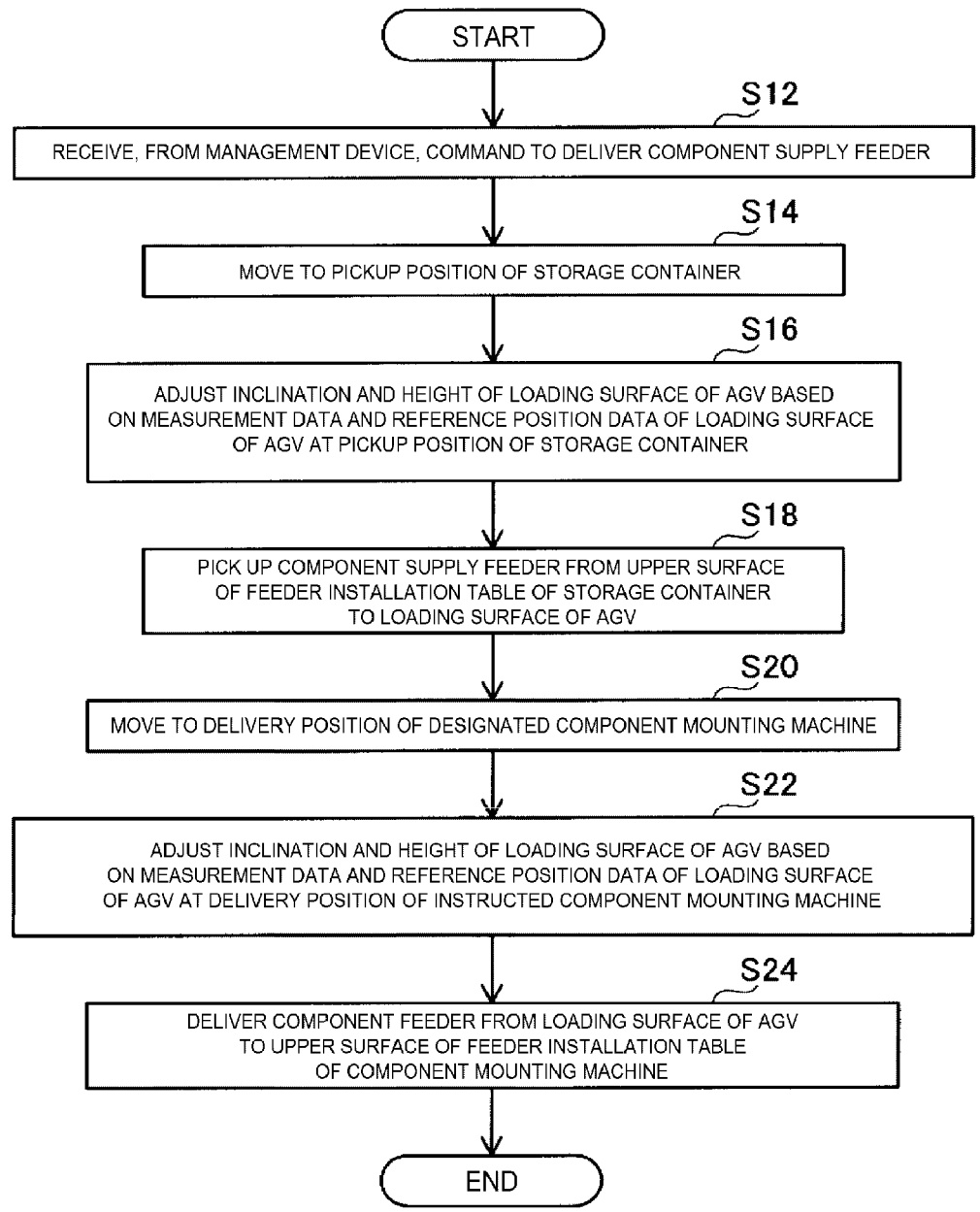
FIG. 10 is a flowchart showing a procedure for causing AGV 10 to deliver component supply feeder 40 to component mounting machine 30.

A procedure for AGV 10 to deliver component supply feeder 40 will be described with reference to FIGS. 10 to 12. Management device 6 manages the production status of each component mounting machine 30 and can determine whether exchange of component supply feeder 40 is necessary for each of component mounting machines 30. When it is determined that the exchange of component supply feeder 40 is necessary for a specific component mounting machine 30 (for example, the component mounting machine #4 in FIG. 1), management device 6 controls storage container 50 to prepare device pallet 42, on which component supply feeder 40 before being used is installed, on feeder installation table 52. In storage container 50, the designated component supply feeder 40 on feeder installation table 52 is set. Management device 6 controls the selected one AGV 10 to deliver component supply feeder 40 to component mounting machine 30 (#4). Management device 6 may control AGV 10, which is on standby in the vicinity of storage container 50 among multiple AGVs 10, to operate based on the stored map in the factory and the positional information of each of AGVs 10.

In step S12, AGV 10 receives, from management device 6, the command to deliver component supply feeder 40 to specific component mounting machine 30 (for example, the component mounting machine #4 in FIG. 1). At this time, control device 12 stores the command from management device 6. Specifically, AGV 10 receives, from management device 6, an identification number (#4) of component mounting machine 30, reference position data of component mounting machine 30 (the drive amount of adjustment device 14), and reference position data of storage container 50 (the drive amount of adjustment device 14), and stores the received identification number and reference position data.

In step S14, AGV 10 makes a move to pickup position P0 of storage container 50. Specifically, when AGV 10 receives the command from management device 6, AGV 10 drives drive device 18 to move AGV 10 to pickup position P0 of storage container 50 based on the map of the factory stored in control device 12. When AGV 10 is positioned at pickup position P0, the process proceeds to the next step S16.

Figure 11:
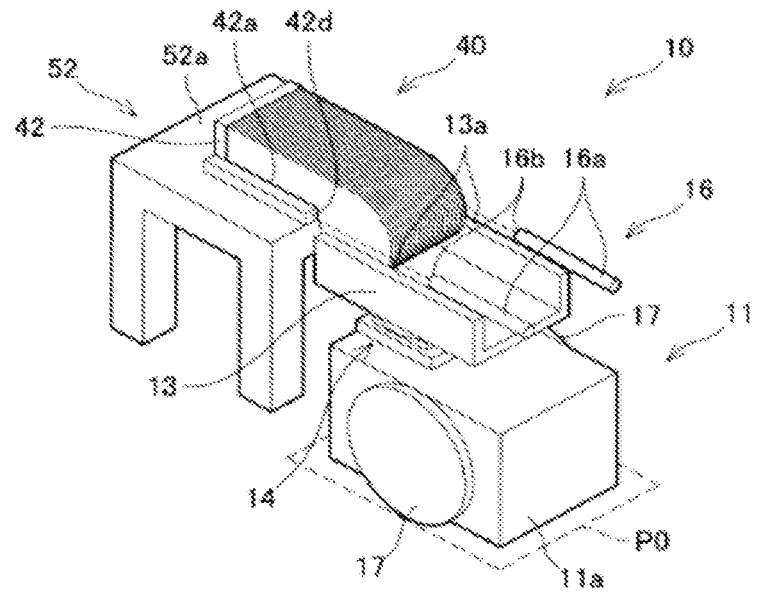
FIG. 11 is a view describing that the inclination and the height of loading surface 13a of AGV 10 are adjusted.

As shown in FIG. 11, in step S16, AGV 10 controls the drive amount of adjustment device 14 to adjust the inclination and the height of loading surface 13a of AGV 10 based on the reference position data (the drive amount of adjustment device 14) at pickup position P0 of storage container 50. When the adjustment of loading surface 13a is completed, the process proceeds to the next step S18.

In step S18, AGV 10 picks up component supply feeder 40 from upper surface 52a of feeder installation table 52 of storage container 50 to loading surface 13a. Specifically, control device 12 drives feeder movement device 16 to move the pair of cylinder sections 16a of feeder movement device 16 toward device pallet 42 on feeder installation table 52. When distal ends 16b of the pair of cylinder sections 16a are in contact with device pallet 42, feeder movement device 16 grips end sections 42d of device pallet 42 by using the catch mechanism and moves device pallet 42 in the front-rear direction in a sliding manner to pull out device pallet 42. When device pallet 42 is positioned at a predetermined loading position on loading surface 13a of AGV 10, the process proceeds to the next step S20. After device pallet 42 is positioned at the loading position, loading surface 13a also returns to the initial state position.

In step S20, AGV 10 makes a move to delivery position P4 of designated component mounting machine 30 (#4). Specifically, AGV 10 drives drive device 18 to make a move to delivery position P4 of designated component mounting machine 30 (#4) based on the map of the factory stored in control device 12. When AGV 10 is positioned at delivery position P4, the process proceeds to the next step S22.

In step S22, the drive amount of adjustment device 14 is controlled to adjust the inclination and the height of loading surface 13a of AGV 10 based on the reference position data at delivery position P4 of designated component mounting machine 30 (#4). When the adjustment of loading surface 13a is completed, the process proceeds to the next step S24.

Figure 12:
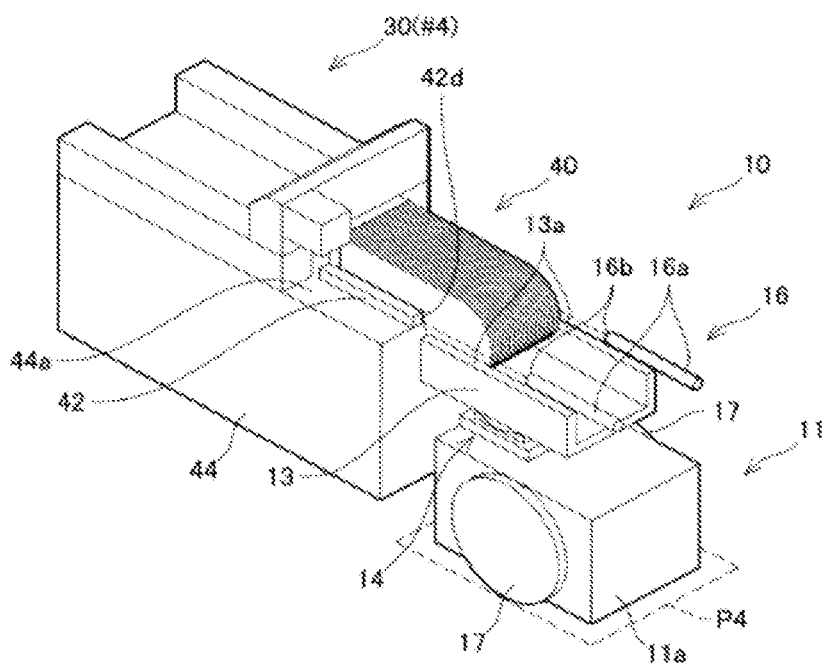
FIG. 12 is a view describing that component supply feeder 40 is delivered from AGV 10 to component mounting machine 30.

As shown in FIG. 12, in step S24, AGV 10 delivers component supply feeder 40 from loading surface 13a to upper surface 52a of feeder installation table 52 of component mounting machine 30. Specifically, control device 12 drives feeder movement device 16, and the pair of cylinder sections 16a of feeder movement device 16 moves device pallet 42 in a direction of pushing device pallet 42 out to feeder installation table 44 while gripping the device pallet 42. When device pallet 42 is positioned at the installation position, the state in which distal ends 16b of the pair of cylinder sections 16a grip end sections 42d of device pallet 42 is released. Control device 12 drives feeder movement device 16 to move the cylinder section 16a to an original position on loading surface 13a. When cylinder section 16a is positioned on loading surface 13a, loading surface 13a also returns to the initial state position.

As a result of the above steps, the procedure for delivering component supply feeder 40 of AGV 10 is completed. When management device 6 determines that it is necessary to exchange component supply feeder 40 in a specific component mounting machine 30 (for example, the component mounting machine #2), and it is necessary to pick up component supply feeder 40 after being used from the specific component mounting machine 30, management device 6 controls AGV 10 to pick up component supply feeder 40 after being used from specific component mounting machine 30. Hereinafter, the procedure for picking up will be described.

AGV 10 receives a command to pick up component supply feeder 40 from management device 6. At this time, control device 12 stores the command from management device 6. Specifically, AGV 10 receives, from management device 6, an identification number (#2) of component mounting machine 30, reference position data of component mounting machine 30, and reference position data at stop position P5 of discharge place 54, and stores the received identification number and reference position data.

Next, AGV 10 makes a move to pickup position P2 of component mounting machine 30 (#2). When AGV 10 is positioned at pickup position P2, AGV 10 drives adjustment device 14 to adjust the inclination and the height of loading surface 13a of AGV 10 based on the reference position data at pickup position P2 of component mounting machine 30 (#2). Next, AGV 10 drives feeder movement device 16 to pick up component supply feeder 40 from upper surface 44a of feeder installation table 44 of component mounting machine 30 (#2) to loading surface 13a.

The procedure for picking up component supply feeder 40 is completed as described above. After AGV 10 picks up component supply feeder 40 after being used, AGV 10 makes a move to discharge position P5 of discharge place 54 and discharges component supply feeder 40 after being used to discharge place 54. The operation at discharge place 54 is performed in the same manner as the operation of delivering component supply feeder 40 to component mounting machine 30.

Figure 13:
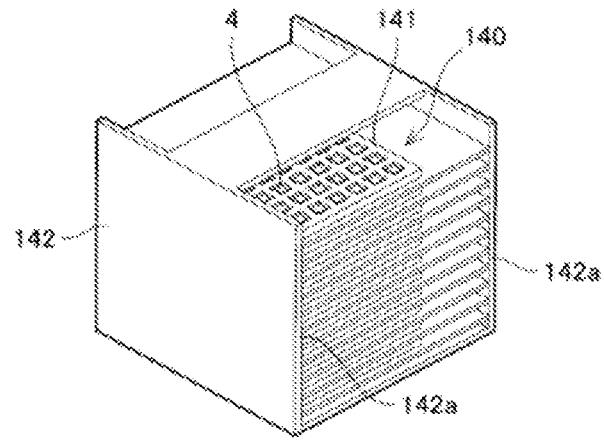
FIG. 13 is a perspective view showing a modification example of component supply feeder 40.

Another embodiment of production system 100 including AGV 10 of the present exemplary embodiment will be described with reference to FIGS. 13 to 16. In the above exemplary embodiment, component supply feeder 40 employs a tape type feeder that accommodates multiple components 4 on a wound tape, but the shape or type of component supply feeder 40 is not particularly limited and may be variously changed in other manners. Further, the configuration of each section of production system 100 can be appropriately changed in accordance with component supply feeder 40. For example, as shown in FIG. 13, component supply feeder 140 may be a tray type feeder in which multiple components 4 are accommodated on tray 141. Multiple component supply feeders 140 are accommodated in tray magazine 142. Multiple component supply feeders 140 (more specifically, tray magazines 142) are installed on the pair of loading surfaces 13a in an attachable and detachable manner. Accordingly, device pallet 42 used in the above exemplary embodiment is not required in multiple component supply feeders 140. Further, the position or the shape of feeder installation table 144 of component mounting machine 30 may be different in accordance with this. Hereinafter, feeder installation table 144 to be changed will be described. Other configurations of the modification example of production system 100 are the same as those of the exemplary embodiment, and duplicate descriptions thereof will be omitted.

Figure 14:
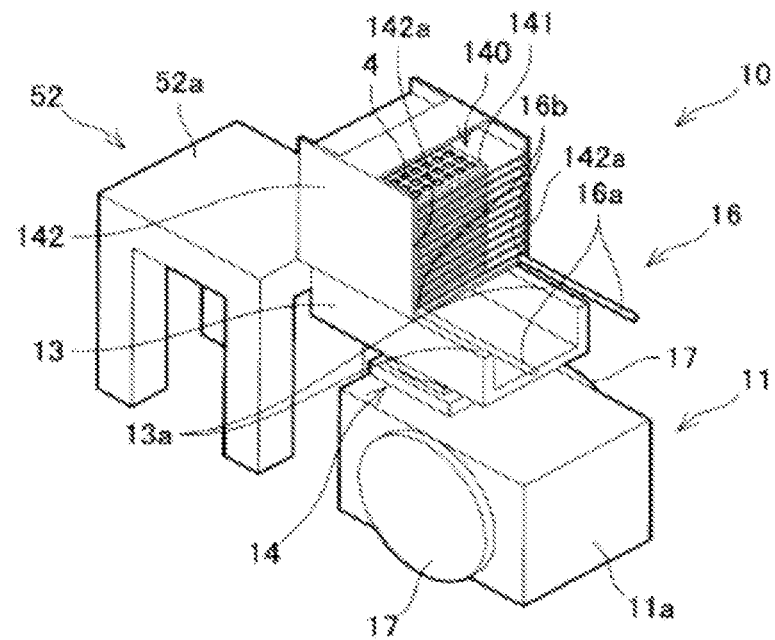
FIG. 14 is a view showing a state in which component supply feeder 140 is installed on loading surface 13a of AGV 10.

As shown in FIG. 14, feeder installation table 144 of component mounting machine 30 may be provided separately from component mounting machine 30 at a position adjacent to component mounting machine 30. Upper surface 144a of feeder installation table 144 is configured to be capable of loading component supply feeder 140. In this case, component supply feeder 140 is loaded on upper surface 144a of feeder installation table 144 when component supply feeder 140 is delivered from AGV 10 to component mounting machine 30.

Figure 15:
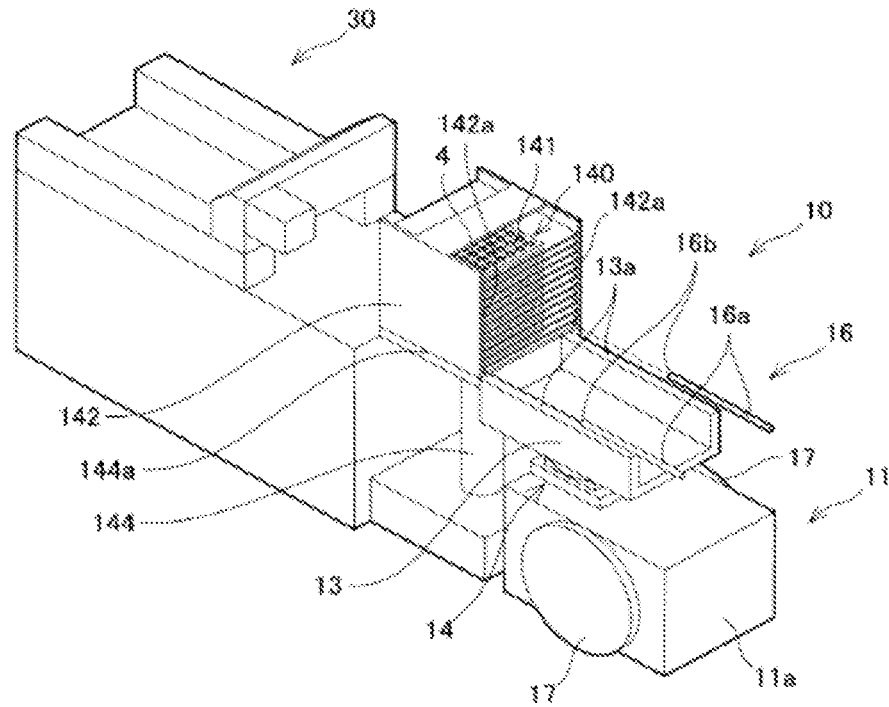
FIG. 15 is a view showing a state in which component supply feeder 140 is installed on feeder installation table 144.

Further, as shown in FIGS. 14 and 15, feeder movement device 16 may also be configured to grip frame section 142a of tray magazine 142 by using the catch mechanism at distal end 16b of each cylinder section 16a. After gripping frame section 142a, feeder movement device 16 may move component supply feeder 140 (specifically, tray magazine 142) by using the piston mechanism. As a result, even with such component supply feeder 140, AGV 10 can reliably move component supply feeder 140 from loading surface 13a to upper surface 144a of feeder installation table 144 of component mounting machine 30 and/or from upper surface 144a of feeder installation table 144 to loading surface 13a of AGV 10.

Figure 16:
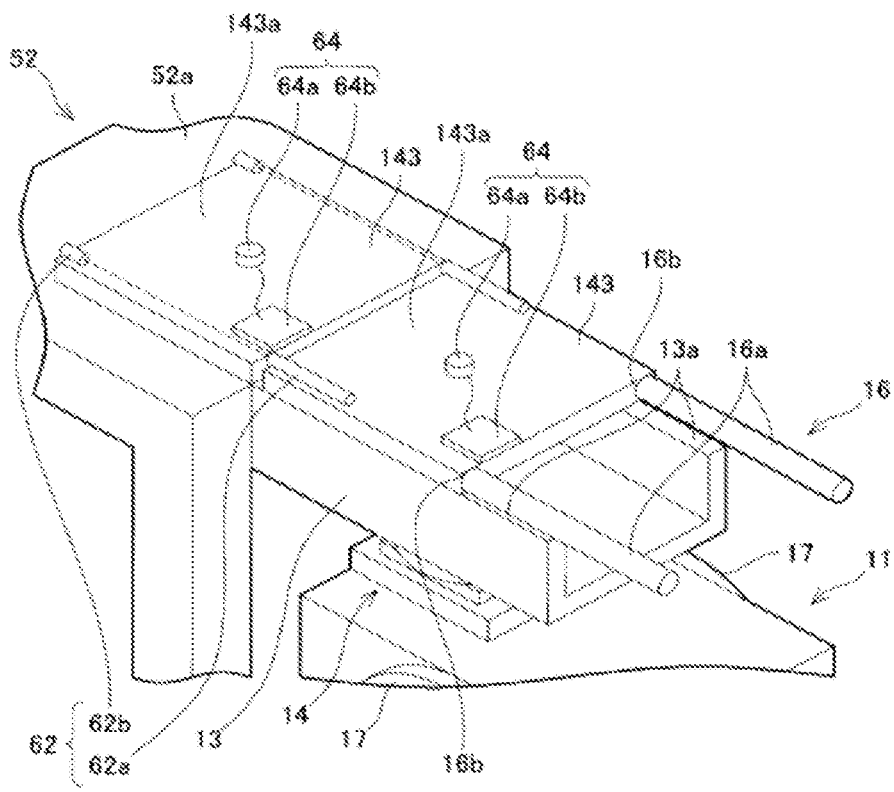
FIG. 16 is a view describing for measurement of the height position and the inclination position of loading surface 13a of AGV 10 with respect to the reference surface when component supply feeder 140 of the modification example is used.

In component supply feeder 140, the advance preparation is also partially different from the exemplary embodiment. As shown in FIG. 16, measurement device 60 may include two measurement pallets 143. Since device pallet 42 is not used, two measurement pallets 143 may be used when measuring the height positions and the inclination positions of upper surfaces 52a and 144a of feeder installation tables 52 and 144 with respect to the reference surface. For example, when measuring the height position and the inclination position of upper surface 52a of feeder installation table 52 of storage container 50, each measurement pallet 143 may be installed on each of loading surface 13a of AGV 10 and upper surface 52a of feeder installation table 52 of storage container 50. Further, on upper surface 143a of each measurement pallet 143, measurement device 60 is installed at each predetermined position so that the operator can perform measurement in the same procedure as in the exemplary embodiment.

The number of storage containers 50 included in production system 100 of the present exemplary embodiment is not particularly limited. Production system 100 may include multiple storage containers 50. In this case, multiple storage containers 50 may include a storage container having a buffer function in the mounting line by temporarily storing component supply feeder 40.

In production system 100 of the present exemplary embodiment, AGV 10 includes adjustment device 14, feeder movement device 16, and control device 12, but these devices may be provided outside AGV 10 (for example, on component mounting machine 30 side). As a result, for example, even when the floor surface of the factory is not flat, AGV 10 can reliably move component supply feeder 40 from loading surface 13a to, for example, upper surface 44a of feeder installation table 44 of component mounting machine 30 and/or from upper surface 44a of feeder installation table 44 of component mounting machine 30 to loading surface 13a.

Although specific examples of the technique disclosed in the present specification have been described in detail, these are mere examples and do not limit the scope of the claims. The technique described in the scope of the claims includes various modifications and variations of the specific examples illustrated above. Technical elements described in the present specification or the drawings exhibit technical usefulness alone or in various combinations, and are not limited to combinations described in claims at the time of filing. The techniques illustrated in the present specification or the drawings can achieve multiple objects simultaneously and provide technical usefulness by achieving one object in the multiple objects.

REFERENCE SIGNS LIST

2: board
4: component
6: management device
6a: memory section
6b: command section
6c: measurement section
10: component mounting machine
11: vehicle body
12: control device
12a: control section
12b: memory section
13: pallet holding section
13a: loading surface
14: adjustment device
16: feeder movement device
17: wheel
18: drive device
20: interface
30: component mounting machine
40, 140: component supply feeder
42: device pallet
42a: upper surface
44, 144: feeder installation table
44a, 144a: upper surface
48: mounting machine control device
50: storage container
52: feeder installation table
52a: upper surface
60: measurement device
62: height measurement device
64: inclination measurement device
64a: sensor
64b: transmitter
100: production system
141: tray
142: tray magazine
142a: frame section

The invention claimed is:

1. An automatic conveyance apparatus, which is employed together with a loading table for loading a member supplied from outside and a production device for producing a specific object by using the member loaded on the loading table, delivers the member before being used on the loading table, and picks up the member after being used from the loading table, the automatic conveyance apparatus comprising:
a vehicle body that rotatably supports wheels;
a drive device that drives the wheels;
a first loading surface supported by the vehicle body and configured to load the member;
an adjustment device configured to adjust a height and an inclination of the first loading surface in accordance with a height position and an inclination position of a second loading surface provided on the loading table on which the member is loaded;
a movement device configured to move the member from the first loading surface to the second loading surface and/or from the second loading surface to the first loading surface; and
a control section configured to
control the adjustment device to adjust the height and the inclination of the first loading surface,
control the drive device to cause the automatic conveyance apparatus to travel between multiple predetermined positions including a member delivery position and a member pickup position, and
drive the movement device to move the member between the first loading surface and the second loading surface when the automatic conveyance apparatus is positioned at one of the member delivery position and/or a and the member pickup position where the automatic conveyance apparatus delivers and/or picks up the member, and when the height and the inclination of the first loading surface are adjusted in accordance with the height position and the inclination position of the second loading surface by the adjustment device.

2. The automatic conveyance apparatus according to claim 1,
wherein the movement device moves the member along the first loading surface and the second loading surface in a sliding manner when the height and the inclination of the first loading surface are adjusted in accordance with the height position and the inclination position of the second loading surface by the adjustment device.

3. A production system comprising:
the automatic conveyance apparatus according to claim 1;
the loading table provided with the second loading surface configured to load the member;
the production device configured to produce the specific object by using the member loaded on the loading table;
a memory section configured to store reference position data including a reference height position and a reference inclination position of the second loading surface with respect to a reference surface set in advance; and
a measurement section configured to measure a height position and an inclination position of the first loading surface with respect to the reference surface,
wherein control section controls the adjustment device to adjust the height and the inclination of the first loading surface based on the reference position data stored in the memory section and the height position and the inclination position of the first loading surface measured by the measurement section.

4. The production system according to claim 3,
wherein the production system includes multiple loading tables provided with the second loading surface configured to load the member,
the memory section stores the reference position data of the second loading surface of the loading table for each of the multiple loading tables, and
when the automatic conveyance apparatus is positioned at the member delivery position and/or the member pickup position of a specific loading table among the multiple loading tables, the adjustment device adjusts the height and the inclination of the first loading surface based on the reference position data of the specific loading table and the height position and the inclination position of the first loading surface measured by the measurement section.

5. The production system according to claim 3,
wherein the loading table is provided in the production device and/or a storage container for storing the members at least temporarily.

6. The production system according to claim 3,
wherein the production device is a component mounter configured to mount a component on a board, and
the member is a component supply feeder configured to supply the component to the component mounter.

7. A production system comprising:
a loading table configured to load a member supplied from outside;
a production device configured to produce a specific object by using the member loaded on the loading table;
an automatic conveyance apparatus configured to deliver the member before being used and/or after being used on the loading table and pick up the member before being used and/or after being used and configured to travel between multiple predetermined positions including a member delivery position and/or a member pickup position, the automatic conveyance apparatus including
a vehicle body that rotatably supports wheels,
a drive device that drives the wheels, and
a first loading surface supported by the vehicle body and configured to load the member;
an adjustment device configured to adjust a height and an inclination of the first loading surface in accordance with a height position and an inclination position of the second loading surface;
a movement device configured to move the member from the first loading surface to a second loading surface included with the loading table and/or from the second loading surface to the first loading surface; and
a control section configured to
control the adjustment device to adjust the height and the inclination of the first loading surface,
control the drive device to cause the automatic conveyance apparatus to travel between multiple predetermined positions, and
drive the movement device to move the member between the first loading surface and the second loading surface when the automatic conveyance apparatus is positioned at one of the member delivery position and the member pickup position, and when the height and the inclination of the first loading surface are adjusted in accordance with the height position and the inclination position of the second loading surface by the adjustment device.

* * * * *